United States Patent [19]

Hsue et al.

[11] Patent Number: 5,429,974
[45] Date of Patent: Jul. 4, 1995

[54] POST PASSIVATION MASK ROM PROGRAMMING METHOD

[75] Inventors: Chen-Chiu Hsue, Hsin-chu; Shing-Ren Shev, Tau-Yuan City; Kuan-Cheng Su, Taipei; Chen-Hui Chung, Hsin-Chu, all of Taiwan

[73] Assignee: United Microelectronics Corporation, Hsinchu, Taiwan

[21] Appl. No.: 139,854

[22] Filed: Oct. 22, 1993

[51] Int. Cl.[6] .................................... H01L 21/8246
[52] U.S. Cl. .................................... 437/52; 437/45; 437/48
[58] Field of Search .................... 437/45, 46, 48, 52, 437/228, 235

[56] References Cited

U.S. PATENT DOCUMENTS

| | | | |
|---|---|---|---|
| 4,356,042 | 10/1982 | Gedaly et al. | 437/45 |
| 4,359,817 | 11/1982 | Dickman et al. | 437/48 |
| 4,467,520 | 8/1984 | Shiotari | 437/52 |
| 4,543,707 | 10/1985 | Ito et al. | 437/238 |
| 4,600,933 | 7/1986 | Richman | 437/391 |
| 5,003,062 | 3/1991 | Yem | 437/238 |
| 5,081,052 | 1/1992 | Kobayashi et al. | 437/29 |
| 5,188,987 | 2/1993 | Ogimo | 437/238 |

OTHER PUBLICATIONS

Wolf, "Silicon Processing for the VLSI Era" vol. 2, Lattice Press, pp. 643–665, 1988.
Wolf et al., "Silicon Processing for the VLSI Era" vol. 1 Lattice Press, pp. 56–58, 280–283, 295–308, 618, 619, 1986.

Primary Examiner—Tom Thomas
Attorney, Agent, or Firm—George O. Saile; Graham S. Jones, Jr.

[57] ABSTRACT

A ROM device with an array of cells has conductors formed in a substrate. Insulation is formed, and parallel conductors are formed orthogonally to the line regions, as thin as about 2000 Å. Glass insulation having a thickness of about 3000 Å or less, formed over the conductors is is reflowed. Contacts and a metal layer on the glass insulation are formed. Resist is patterned and used for etching the resist pattern in the metal. Removal of the second resist and device passivation with a layer having a thickness of about 1000 Å, precede activation of the impurity ions by annealing the device at less than or equal to about 520° C. in a reducing gas atmosphere. After resist removal, a second resist is formed and exposed with a custom code pattern to form a mask. Ions are implanted into the substrate with a dosage of between about 1 E 14 and 3 E 14 atoms/cm$^2$ with an energy of less than or equal to 200 keV adjacent to the conductors through the openings in the insulation.

18 Claims, 6 Drawing Sheets

FIG. 1A - Prior Art

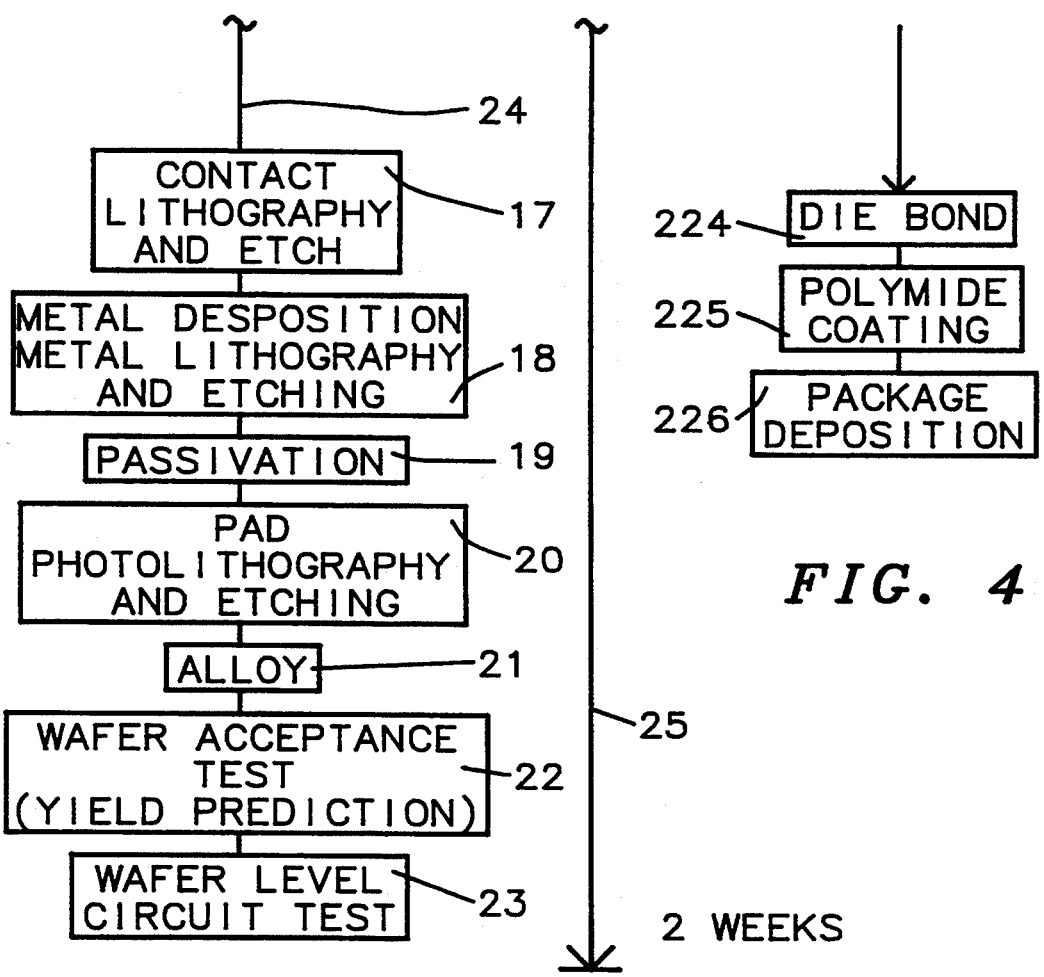
FIG. 1B – Prior Art

POST PASSIVATION MASK ROM PROGRAMMING METHOD

BACKGROUND OF THE INVENTION

1. Field of the Invention

This invention relates to Read Only Memory (ROM) manufacturing techniques and more particularly to code implanting during ROM manufacturing.

2. Description of Related Art

ROM devices are standard components of modern computer systems. A ROM comprises an array of Metal Oxide Semiconductor Field Effect Transistors (MOSFET's) arranged in columns and rows, wherein predetermined MOSFET's are either permanently conductive or nonconductive as a function of the variety of transistor. The alternative on/off operation of these devices states of the MOSFET's is adapted to use for storage of data, which remains in the device when the external power supply is off.

A ROM device includes an array of parallel, closely spaced lines regions formed of a heavily doped impurity in a semiconductor substrate having an opposite type of background impurity. On the surface of the substrate an insulating layer is formed thereon. Another array of closely spaced conductive lines formed on the surface of the insulating layer is arranged at right angles to the spaced lines in the substrate. Insulating layers are formed on the upper array of conductive lines. A metallurgy layer connects the two arrays of lines to circuits to address the lines and to read the data stored in the RAM, as is well known in the art.

At the intersection of a conductive line in the upper array which is commonly referred to as a "word line" and a pair of adjacent lines in the substrate, known as the "bit lines", a MOSFET is formed. The spaced lines in the substrate comprise the source and drain for the MOSFET. The conductive word line serves as the gate electrode of the MOSFET. Certain predetermined MOSFET's can be made permanently conductive by forming a region of an impurity of the same type as that in the bit lines, between adjacent bit lines and beneath the corresponding conductive line. These permanently conductive regions are known as code implants, and they are placed in the substrate to provide specific binary data.

The conventional manufacturing process is to form the code implant regions very early in the ROM fabrication process, since an annealing step is required to activate the implanted impurity and also to recrystallize any implanted areas of the substrate. The annealing process involves heating the substrate above an acceptable temperature, which would damage the completed device, since the aluminum metallization, conventionally used, is damaged above a temperature of from about 400° C. to about 450° C. for more than a minimum time interval, and the maximum possible temperature is the melting point of aluminum which is about 660° C.

FIGS. 1A and 1B are a flow chart of the prior art process for manufacturing a ROM. Function 10 comprises the early stage of the prior art process for forming a ROM commencing with an N- doped semiconductor substrate upon which a P-well is formed by doping with an opposite (P-) type of dopant. Above the P-well is formed a silicon dioxide gate oxide layer about 200 Å thick. Above the gate oxide layer, word lines are formed from a layer of polysilicon followed by a layer of a refractory silicide (polycide), each about 1500 Å thick. The refractory silicide is selected from silicides of refractory metals such as Ta, W, Ti and Mo.

In function 11, silicon dioxide spacers are formed adjacent to the word lines and the conventional N+ implant and P+ implant processes are performed.

After a long hiatus contrasted with the steps in FIG. 2, (described below) which shows the process flow chart of the instant invention, in function 12, the prior art process continues with application of a layer of photoresist which is then patterned with a mask and exposure of the resist.

In function 13, boron $B^{11}$ dopant ions are implanted adjacent to the spacers with an ion implanter operating at an energy level of about 180 keV.

In function 14, the prior art process continues with formation of a layer 24 of USG (Undoped Silicon Glass) by APCVD (Atmospheric-Pressure Chemical Vapor Deposition) to a thickness of about 1,500 Å.

In function 15, a BPSG layer is deposited to a thickness of about 7,200 Å with boron (B) about 3.0% and phosphorous (P) about 4.6%. The process used in the prior art to deposit the BPSG layer 26 also comprises APCVD.

In function 16, the prior art device of function 15 has been heated to reflow the BPSG layer at a temperature of about 900° C. which reflows the BPSG layer 26, thereby planarizing the USG layer 24 and BPSG layer 26 with a combined thickness remaining at about 8700 Å.

In function 17, the device of function 16 is subjected to formation of contacts by photolithography.

In function 18, the device of function 17 is coated with a metal layer, followed by a process of photolithography and etching.

Next in function 19, a passivation step is performed.

In function 20, pad lithography and etching are performed.

In function 21, formation of the alloy is done.

In function 22, a wafer acceptance test involving yield prediction is performed.

Finally in function 23, a wafer level circuit test is performed about two weeks after function 12, which demonstrates the long time which elapses between the deposit of the implant when using the prior art process when contrasted with the one day which elapses between functions 12 and 23 when the present invention is employed as illustrated in FIG. 2 where similar functions have similar numbers.

The conventional mask ROM programming methods include: programming by field oxide, channel ion implant, etc. It is desirable for a mask ROM that small die size, coincides with short turn around time. However, it is difficult when a conventional process, such as one of the above mentioned methods, is used for the process to achieve a short turn around time. This invention uses existing facilities in an industrial laboratory to achieve the short turn around time goal in an industrial factory.

In Hong et al "Very Late Programming Process for Mask ROM" 08/125,182 filed Oct. 23, 1993 a process of ROM manufacture includes buried bit lines, covered by a thin gate oxide layer on which polysilicon word lines are formed which are covered with a thick film of BPSG between 3,000 Å and 8,000 Å thick. Metallization is applied formed of aluminum, a refractory metal, refractory metal silicide or heavily doped polysilicon. The refractory metal or the refractory metal silicide are stated to be preferred because they will withstand higher temperatures than aluminum and can be annealed at 850° C. for about 15 minutes or 900° C. for 5 minutes. A resist layer is applied and patterned to define a code implant pattern. The code implantation is performed preferably with boron $B^{11}$ ions at a power of about 180 keV with an implantation dosage of about 1 E 13 to 1 E 14 atoms/cm$^2$. After implantation of the ions they are activated. Preferably, a passivating layer of silicon dioxide or silicon nitride in the range of 5,000 Å to 10,000 Å thick deposited by PECVD. When the metallization is aluminum with a thick barrier metal layer, the activation of the implanted ions and recrystallization "must be done by rapid thermal annealing (RTA). In the critical RTA process . . . the device must be heated to a temperature not greater than about 650° C., but above a temperature of 550° C. and maintained for a time in the range between 3 and 10 minutes. The atmosphere of the RTA process may be an inert gas such as nitrogen."

Applicants find that it is difficult to employ an implant energy of 180 keV to implant through a thickness of 3,000 Å or particularly through a structure comprising a 9,000 Å thick combination of BPSG and a polycide word line. Accordingly an object Of this invention is to use a thinner layer of BPSG with a thickness less than about 3,000 Å.

The double charge method has a very low throughput, which is not well adapted to mass production.

The late programming etch back method is not adapted to a practical application from the point of end point issues and it is more complicated than desired. Accordingly an object of this invention is to avoid the late programming etch back method.

An object of this invention is to employ a lower temperature annealing process to achieve a high throughput.

Another object of this invention is an improved narrow metal pattern processing technique.

A further object of this invention is to employ an improved thinner BPSG layer.

This invention provides a method to achieve the shortest turn around time and pre-wafer out device accept prediction functions.

The turn around time is about one day from ROM lithography to the end of the fully finished wafer process.

An object of this invention is a lower temperature annealing process.

Another object of this invention is an improved narrow metal pattern processing technique.

A further object of this invention is to employ an improved BPSG layer in the process.

Advantages of this invention include the following:
1. After the whole process is completed (except for the process of custom code parts) then programmed by using a low cost production type (compared with high energy implanter) medium current implanter to achieve shortest turn around time.
2. Medium current implant results low damage of Antana effect and low sidewall bleeding effect (smaller cell size can be applied.)
3. Pre-wafer out device accept test can be performed during stage for custom code. Circuit test may be performed directly after process finished.
4. Thin oxide passivation layer also can prevent metal corrosion problem during the stage period.

SUMMARY OF THE INVENTION

An improved method of manufacturing a Read Only Memory device with an array of cells comprises
a) forming a plurality of closely spaced line regions with a first impurity type in and adjacent to the surface of a semiconductor substrate having a background impurity of a second opposite type,
b) forming a thin insulating layer of the surface of the substrate,
c) forming a plurality of closely spaced, parallel, thin, electrically conductive lines on the thin insulating layer arranged orthogonally relative to the line regions,
d) forming a thin glass insulating layer over the conductive lines,
e) reflowing the glass insulating layer to provide planarization thereof,
f) forming contacts,
g) forming a metal layer on the glass insulating layer,
h) depositing a resist layer on the metal layer,
i) exposing the resist layer with a metal pattern, etching through the resist layer to form patterned metal and removing the resist layer,
j) depositing a second resist layer onto the patterned metal, and exposing the second resist layer with a custom code pattern,
k) developing the resist layer into a mask,
l) etching exposed areas of the insulating layer to form openings exposing selected areas of the conductive lines,
m) implanting impurity ions into the substrate adjacent to the conductive lines through the openings in the insulating layer,
n) removing the resist layer,
o) passivating the device with a thin layer,
p) activating the implanted impurity ions by annealing the device at a temperature less than or equal to about 520° C. in forming gas (comprising nitrogen gas, $N_2$ and hydrogen gas, $H_2$) or nitrogen gas, $N_2$, whereby the metallurgy and the electrical contacts to the substrate, line regions and conductor lines are protected from adverse effect during annealing.

Preferably, the glass insulating layer comprises USG; the overlayer comprises doped silicon dioxide in the form of BPSG; and the passivation layer comprises a material selected from the group consisting of silicon nitride and silicon dioxide having a thickness of less than about 2,000 Å, and within the range between about 500 Å and about 2,000 Å.

Preferably, the glass insulating layer comprises a sublayer of undoped glass having a thickness of about 1000 Å and an overlayer of doped glass having a thickness of between about 1000 Å and about 2000 Å. The passivation layer comprises a material selected from the group consisting of silicon dioxide and silicon nitride having a thickness of less than about 2,000 Å; and the conductive lines have a thickness of less than or equal to about 2000 Å.

BRIEF DESCRIPTION OF THE DRAWINGS

The foregoing and other aspects and advantages of this invention are explained and described below with reference to the accompanying drawings, in which:

FIGS. 1A and 1B are a flow chart of the prior art process for manufacturing a ROM.

FIG. 4 is a flow chart of the packaging process employed in accordance with this invention.

DESCRIPTION OF THE PREFERRED EMBODIMENT

Figure 2:
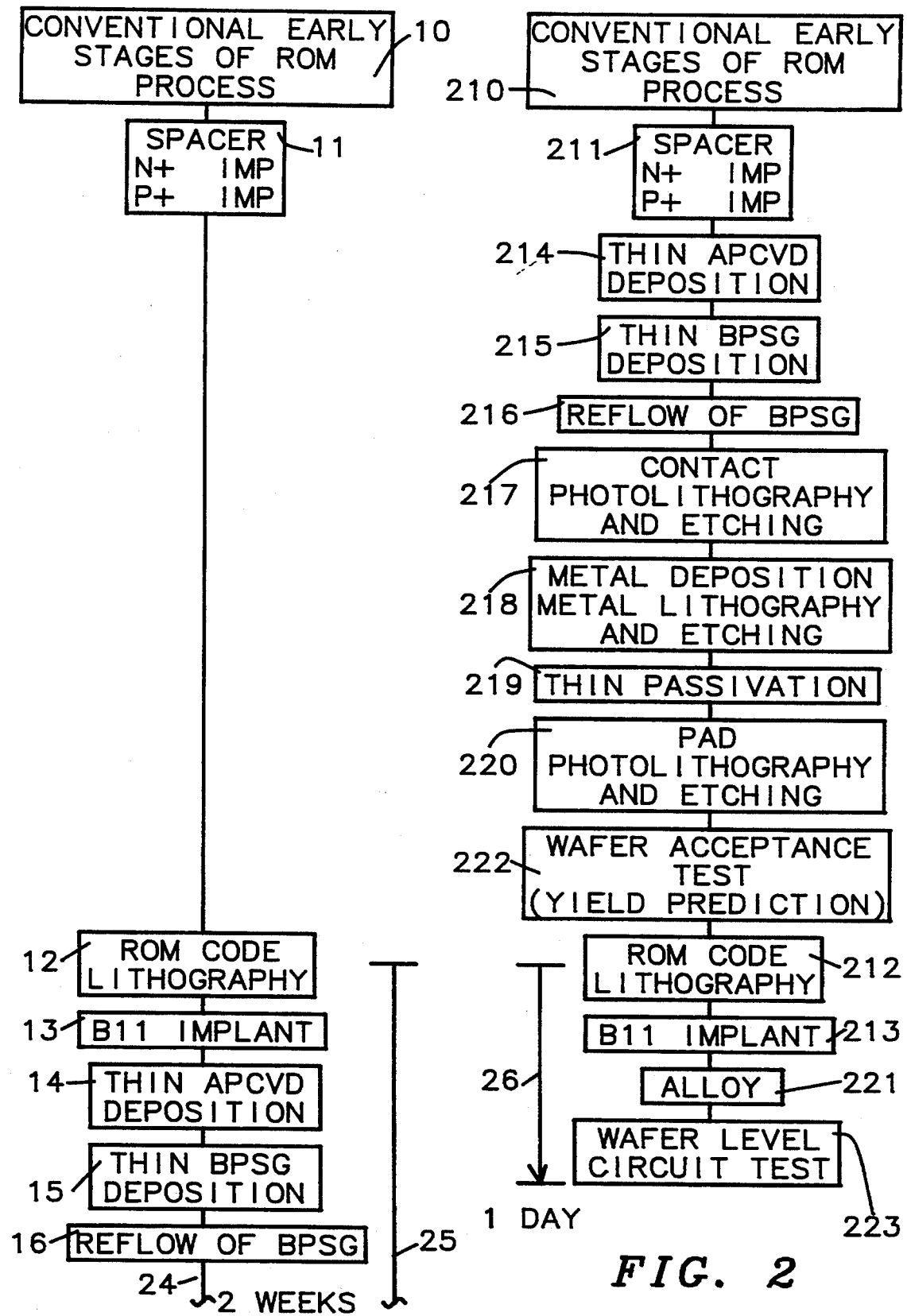
FIG. 2 is a flow chart of the process in accordance with this invention for manufacturing a ROM.

FIG. 2 is a flow chart of the process in accordance with this invention for manufacturing a ROM. Function 210 comprises the early stage of the process in accordance with this invention for forming a ROM commencing with an N- doped semiconductor substrate upon which a P-well is formed by doping with an opposite (P-) type of dopant. Above the P-well is formed a silicon dioxide gate oxide, insulating, layer 34 about 200 Å thick. Above the gate oxide layer, word lines are formed from a layer of polysilicon 36 followed by a layer of a refractory silicide (polycide), each about 1500 Å thick. The refractory silicide 38 is selected from silicides of refractory metals such as Ta, W, Ti and Mo.

In function 211, silicon dioxide spacers 40 (FIG. 3A) are formed adjacent to the word lines and the conventional N+ implant and P+ implant processes are performed.

As contrasted to the hiatus between functions 11 and 12 in FIG. 1, function 214 immediately follows function 211.

In function 214, the process continues with formation of a layer 44 (FIG. 3B) of USG (Undoped Silicon Glass, which is sometimes referred to as undoped BPSG) by APCVD (Atmospheric-Pressure Chemical Vapor Deposition or PECVD (Plasma Enhanced C.V.D.) to a thickness of about 1500 Å.

In function 215, a BPSG (or BPTEOS) layer 46 (FIG. 3C) is deposited to a thickness of preferably about 2,000 Å (within the range from about 1,000 Å to about 2,000 Å) with boron (B) about 3.0% and phosphorous (P) about 4.6%. The process used to deposit the BPSG layer is described in greater detail below in connection with FIG. 3C.

In function 216, the device of function 215 has been heated to reflow the USG layer and the BPSG layer at a temperature of about 900° C.

In function 217, after the device of function 216 has been subjected to formation of contacts by photolithography.

In function 218, the device of function 217 is coated with a metal layer, followed by a process of photolithography and etching.

Next in function 219, a thin passivation step is performed.

In function 220 pad lithography and etching are performed.

In function 221 formation of the alloy is done.

In function 222 a wafer acceptance test involving yield prediction is performed.

Function 212 follows function 222 which is much later in the process than corresponding function 12 in FIG. 1. This is a change which greatly shortens the cycle time required to complete the process once the ROM implant program is known. The process continues with application of a layer of photoresist in function 212 which is then patterned with a mask and exposure of the resist.

In function 213, boron $B^{11}$ dopant ions are implanted adjacent to the spacers with an ion implanter operating at an energy level of about 180 keV.

Finally in function 223, a wafer level circuit test is performed with a very brief cycle time of about one day after function 212, which demonstrates the brief time which elapses between the deposit of the implant when using this process when contrasted with the prior art process cycle time of two weeks which elapses between functions 12 and 23 in FIG. 2 where similar functions have similar numbers.

Figure 3A:
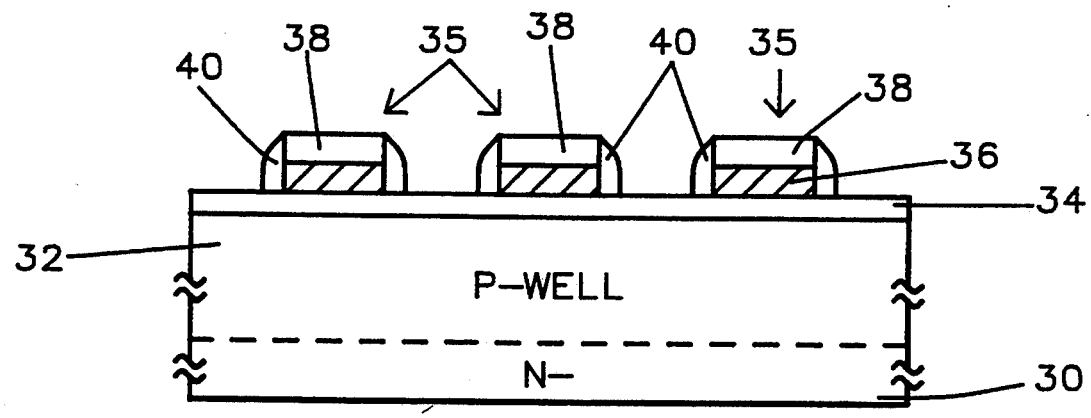
FIGS. 3A–3H illustrate the process of forming a ROM device in accordance with this invention.

As shown in FIG. 3A, an early step in the process of forming a ROM device (corresponding to function 210 in FIG. 2), in accordance with this invention commences with an N-doped semiconductor substrate 30 upon which a P-well 32 is formed by doping with an opposite (P-) type of dopant. Above the P-well 32 is formed a silicon dioxide gate oxide insulating layer 34 about 200 Å thick. Above the gate oxide layer 34, word lines (gate electrodes) 35 are formed from a sublayer of polysilicon 36 followed by an overlayer of a refractory metal silicide (known as polycide) 38. The refractory metal silicide is preferably tungsten silicide, or polysilicon titanium silicide, etc. Where there are two layers 36 and 38 in the word lines 35 each has a thickness of about 1500 Å thickness. Adjacent to the word lines 35 are formed silicon dioxide spacers 40.

In addition the spacer structure and the N+ implant and P+ implant steps are performed as in function 211 in FIG. 2.

Figure 3B:
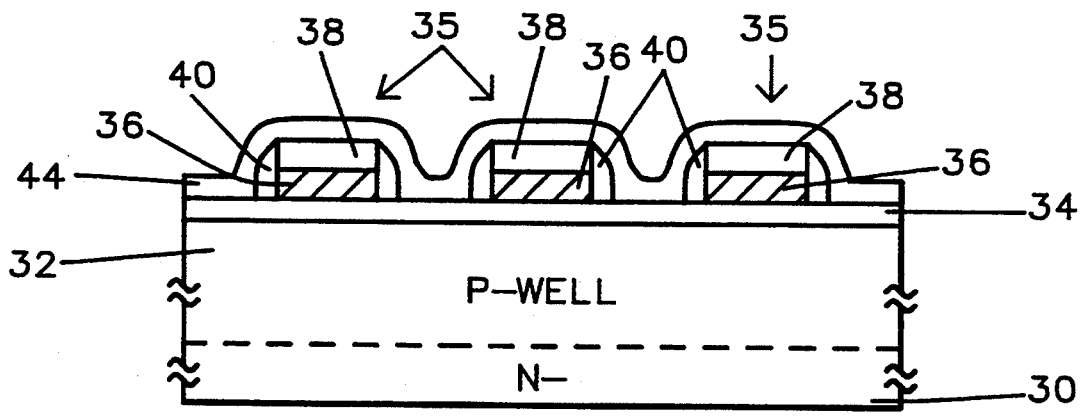

In FIG. 3B, (corresponding to function 214 in FIG. 2) the process of the present invention continues with formation of a thin layer 44 of USG (Undoped Silicon Glass, which is sometimes referred to as undoped BPSG) by APCVD (Atmospheric-Pressure Chemical Vapor Deposition or PECVD (Plasma Enhanced C.V.D.) to a thickness of about 1,000 Å.

Figure 3C:
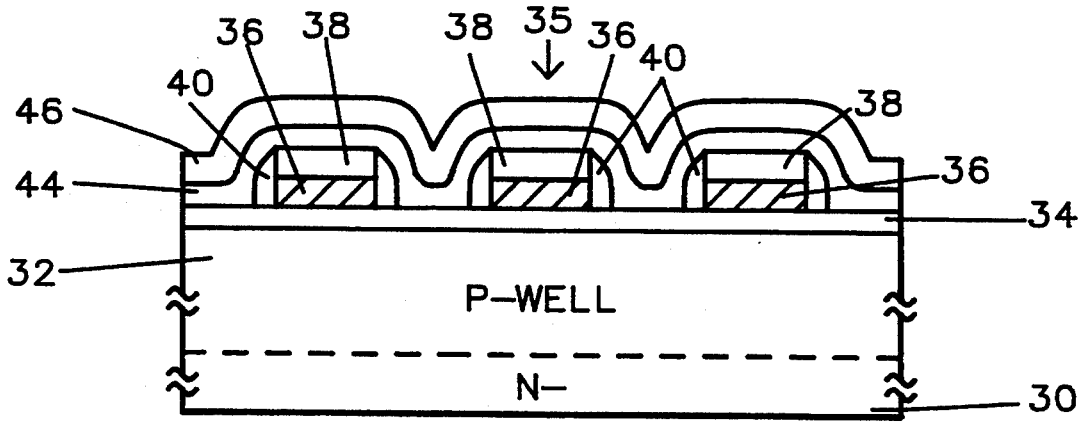

In FIG. 3C, (corresponding to function 215 in FIG. 2) the next step of the process of the present invention is to deposit a BPSG layer 46 with a preferred concentration of boron (B) of about 3.0 wt. % (preferably within the range from about 2.5 wt. % to about 5 wt. %) and with a preferred concentration of phosphorous (P) of about 5.2 wt. % (preferably within the range from about 3 wt. % to about 5.5 wt. %). The process used to deposit the BPSG layer 46 employs an instrument selected from APCVD, PECVD, LPCVD (Low Pressure C.V.D.) which deposits BPSG, BPTEOS, TEOS, etc.

The typical BPTEOS composition of a boron-phosphorous $SiO_2$ is boron 4 wt. %, phosphorous 4 wt. %. The range is the same as above.

Figure 3D:
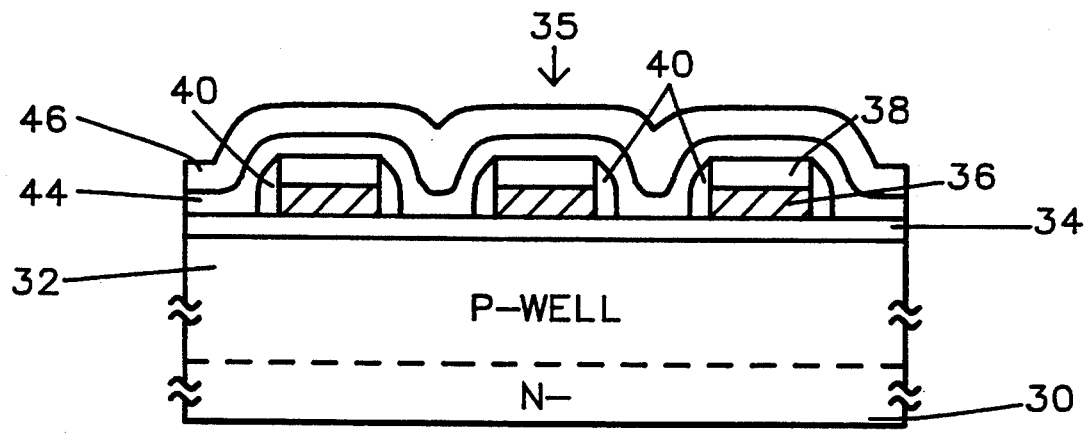

In FIG. 3D, (corresponding to function 216 in FIG. 2) the device of FIG. 3C has been heated to reflow the device of FIG. 3C covered with BPSG layer 46 at a temperature of about 900° C., which planarizes the combined USG layer 44 and BPSG layer 46. The undoped USG layer 44 remains about 1,000 Å thick. The thickness of layer 46 is reduced to about 1,500 Å thickness and the combined thickness of layers 44 and 46 is reduced to about 2,500 Å in the locations above the word line region. The combined word lines 35 (layers 36 and 38) remain about 3,000 Å thick for a total thickness of about 5,500 Å. The ranges of thickness of USG after the reflow is about 1,000 Å. The thickness of the BPSG after the reflow is within the range from about 1,000 Å and about 2,000 Å.

Next a step of formation of contact 56, is performed involving formation of a resist mask and etching to form contact 56 as shown in FIG. 2.

Figure 3E:
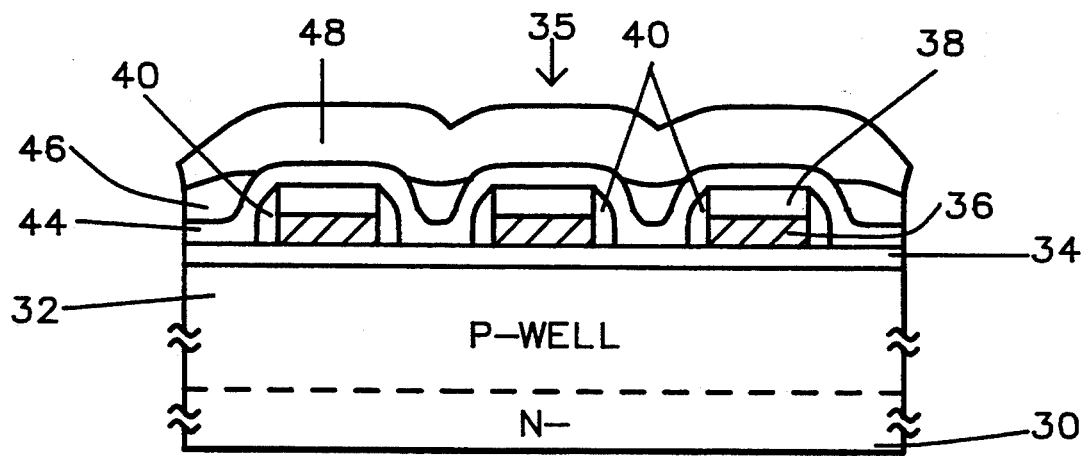

In FIG. 3E, (corresponding to function 218 in FIG. 2,) after the device of FIG. 3D has been subjected to formation of contacts by photolithography and etching, it is coated with a metal layer 48, preferably by sputtering. In accordance with this invention, the metallization is a first layer of titanium (Ti) about 500 Å thick. Then an RTA (Rapid Thermal Anneal) is performed to form TiSi$_2$. Next, aluminum (Al) is deposited preferably about 10,000 Å thick (within the range from about 8,000 Å to about 11,000 Å) and a thin upper layer of TiN (titanium nitride) preferably about 800 Å thick (within the range from about 100 Å to about 400 Å)

Figure 3F:
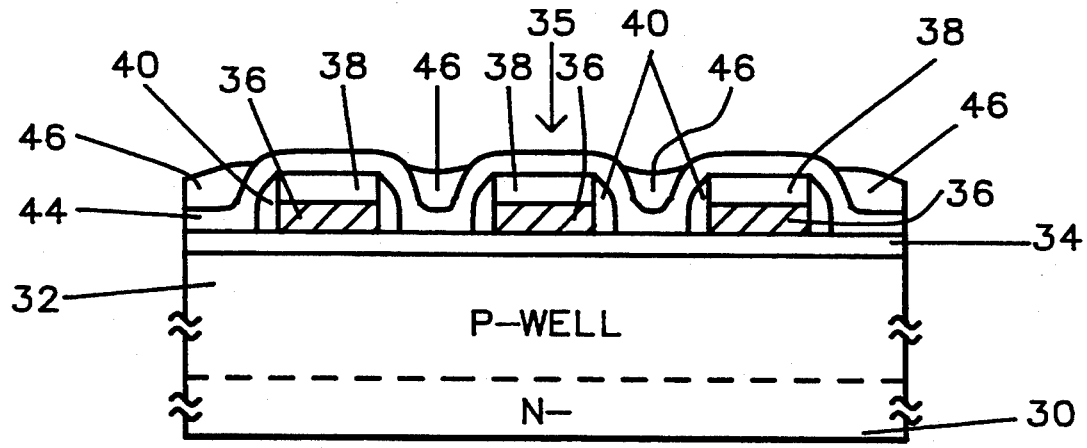

In FIG. 3F, (which also corresponds to function 218 in FIG. 2), after the metal 48 is deposited, photoresist is then applied, masked and developed in the form of the metal pattern desired. The metal 48 is deposited and then etched leaving the device generally having the cross section shown in FIG. 3D without the metal left in the area desired for the code implant. However, during the etching substantially all of the BPSG layer 46 is also removed, leaving behind the layer beneath comprising the 1,000 Å thick USG layer 44 (with a range of thicknesses of USG layer 44 between about 500 Å and 1,500 Å) Above the channel are a layer of gate oxide 34 (200 Å), polysilicon layer 36 (1,500 Å), polycide 38 (1,500 Å), and USG layer 44 (1,000 Å.)

Figure 3G:
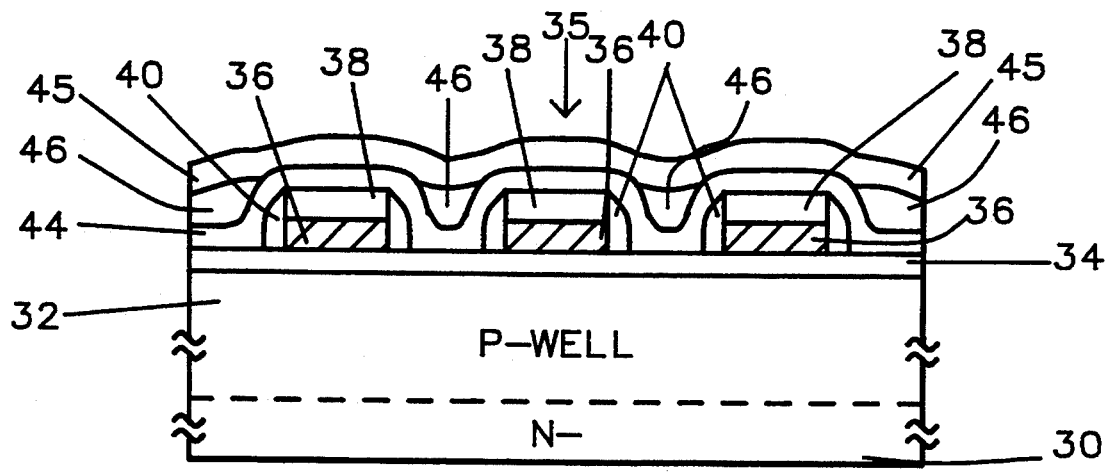

In FIG. 3G, (corresponding to function 219 in FIG. 2), a thin passivation step is performed in which passivation layer 45 is deposited by PECVD of silicon dioxide (SiO$_2$), PSG (Phosphorous Silicon Glass) or polysilicon glass/Si$_3$N$_4$, or oxynitride, etc. on the product of FIG. 3F with a thickness preferably of 1,000 Å, typically less than about 2,000 Å. The thickness of passivation layer 45 is preferably within a range from about 500 Å to about 2,000 Å.

Following the steps shown in FIG. 3G, the next steps are code etching, passivation and pad etching.

In function 220 pad lithography and etching are performed with application of a layer of photoresist 42 followed by etching.

In function 222, following function 220, a wafer acceptance test involving yield prediction is performed.

Figure 3H:
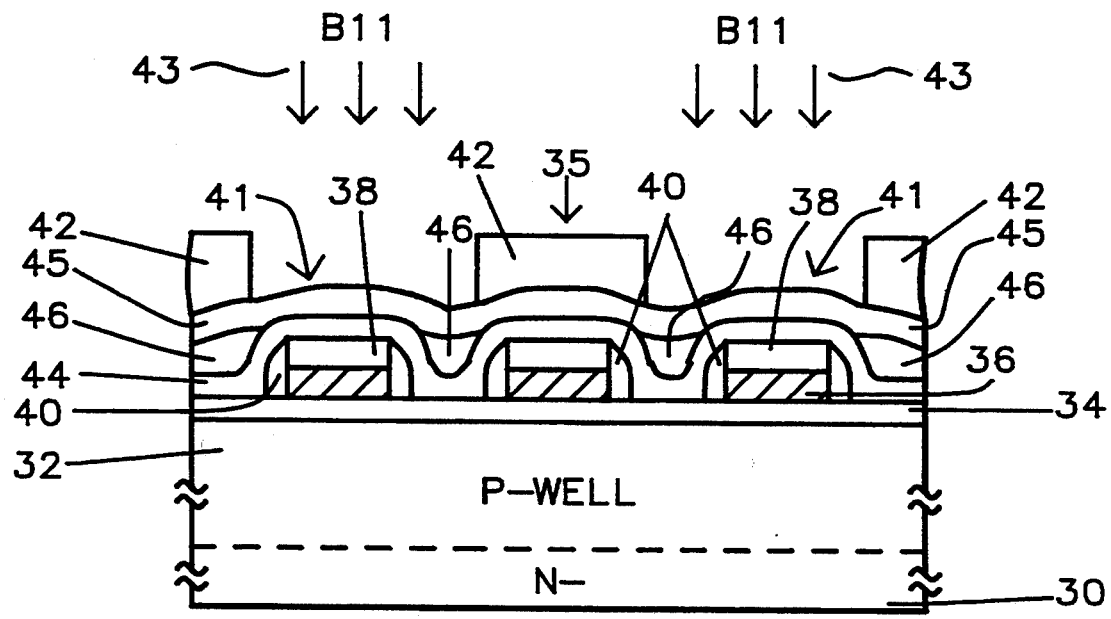

Next in FIG. 3H, (corresponding to function 212 in FIG. 2) the device is appropriately patterned by ROM code lithography.

Next again in FIG. 3H (in a step corresponding to function 213,) an implantation step is performed in which ions 43 of boron B$^{11}$ dopant are implanted adjacent to the spacers 40 with an ion implanter operating at an energy level of about 180 keV (which can range from about 160 keV to about 200 keV with an implantation dosage concentration of about 1 E 14 atoms/cm$^2$ to about 3 E 14 atoms/cm$^2$.

Following the steps shown in FIG. 3H, the next step is function 221, during which an alloy is formed.

Subsequently, the final step of the process is function 223, which is a wafer level circuit test.

In most conventional cases the mask turn around time requires about several weeks. Poor yield prediction is a problem that exists between. In a conventional process such as the one shown in FIG. 1, the circuit cannot be tested due to the fact that the process has not completed metallization finish.

In accordance with this invention, all of the circuits are well done except for the the custom code (ROM code) but we can test all of the ROM (Memory) cells. All of the cells should be in the ON state without the code implant, so the circuit yield can be predicted. Thus wasting of underestimated yield and insufficient parts because of over estimated yield are two basic trade-off problems.

Significant features of this invention are as follows:
1. After passivation, the code is implanted.
2. Thinner BPSG layer and thin passivation layer and thin gate electrode. Therefore it is required to have a special package with additional passivation.

Referring to the additional process steps which follow the wafer level circuit test 223 in FIG. 2B, the passivation will improve by the packaging process shown by the flow chart in FIG. 4 functions 224 to 226. In that packaging process a die bond function 224 is followed by a polyimide coating function 225 which is, in turn, followed by the packaging function 226. Comparisons between values for the normal process and the preferred values and ranges for the process of this invention are listed in the tables below.

TABLE I

| LAYER | STANDARD PROCESS THICKNESS | NEW PROCESS THICKNESS |
| --- | --- | --- |
| GLASS (USG/BPSG) | 8,700 Å | 3,000 Å |
| PASSIVATION | 10,000 Å | 1,000 Å |
| GATE ELECTRODE | 4,000 Å | 2,000 Å |

TABLE II

| | CODE IMPLANT | |
| --- | --- | --- |
| | STANDARD PROCESS PARAMETERS | NEW PROCESS PARAMETERS |
| ENERGY | >400 keV | ≦200 keV |
| | | 160 keV to 200 keV |
| DOSAGE | 9 E 13 | 1 E 14 to 3 E 14 |
| ACTIVATION TEMP. | >800° C. | 450° C. |
| Range | >800° C. | 420° C. to 520° C. |

Figure 5:
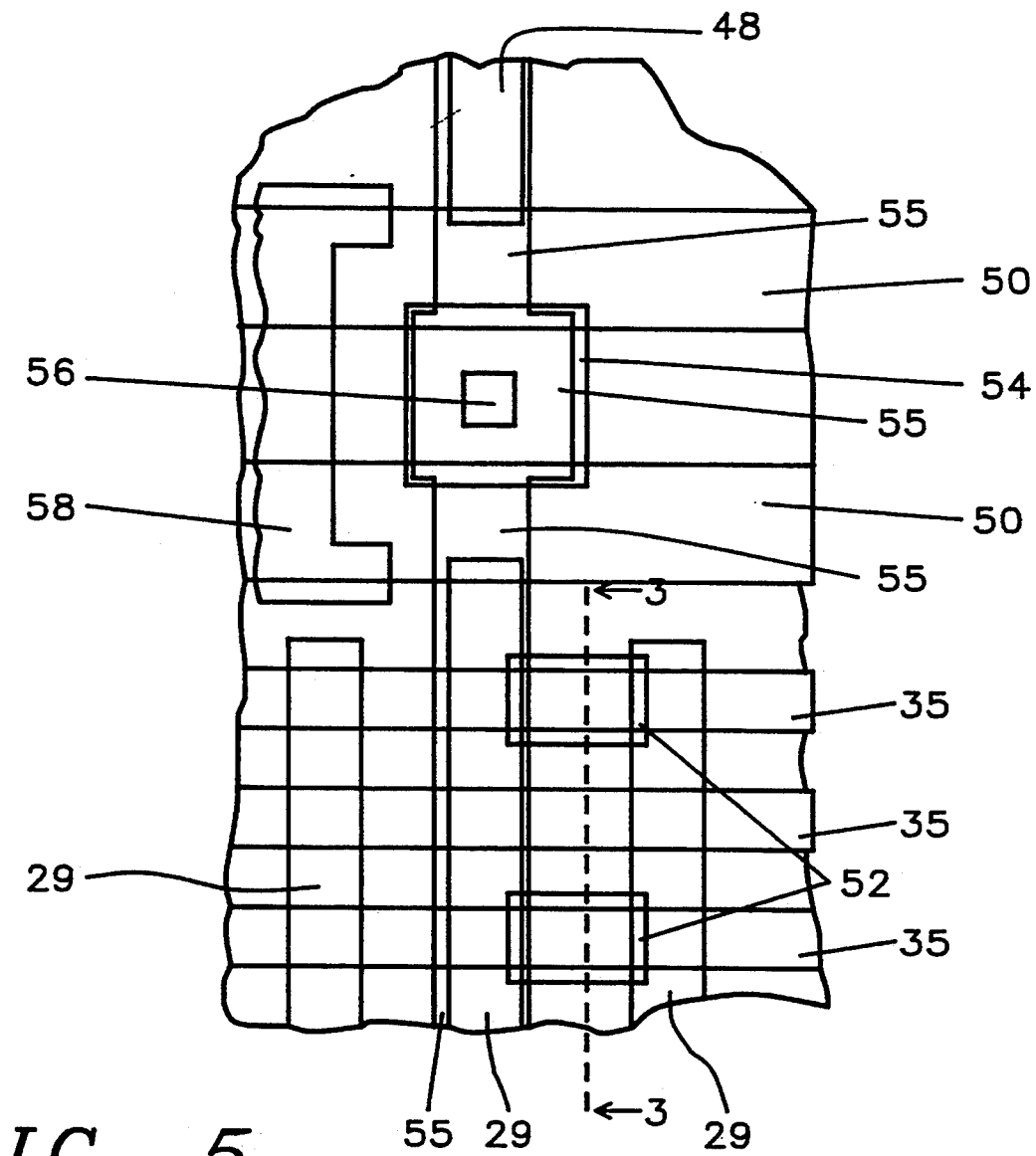
FIG. 5 shows a fragmentary plan view of a ROM formed in accordance with this invention.

Referring to FIG. 5, a fragmentary plan view of a ROM in accordance with this invention is shown. A pair of word lines 35 are shown extending from left to right across the page. A set of buried bit lines 29 in the semiconductor are shown extending at right angles to the word lines, within the semiconductor substrate 30, as shown in FIG. 3A. A metal structure 48 comprises TiN/Al/TiN (800 Å/10,000 Å/300 Å) which serves the provides a main bit line in cooperation with a word line to access a specified bit of ROM data. Beneath the metal element 48 is a buried bit line. Between the buried bit lines is the ROM channel and placement of metal should be avoided in this region. Element 50 comprises a selector (polycide word line) which serves the purpose of selection of one of two adjacent cells.

Element 52 comprises a custom ROM code outside of the cell area which serves the purpose of a Mask ROM data storage element. Element 54 comprises a buried drain which serves the purpose of a main bit line pick up for bank cells. A 16, 32 or ... word line set is employed. Element 56 comprises a contact which serves the purpose of interconnection between the main metal bit line and bank cells. Metal 55 bypasses the cell channel area.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacturing a Read Only Memory device with an array of cells comprising:
   a) forming a plurality of closely spaced line regions with a first impurity type in and adjacent to the surface of a semiconductor substrate having a surface and a background impurity of a second opposite type,
   b) forming a thin insulating layer on said surface of said substrate,
   c) forming a plurality of closely spaced, parallel, thin, electrically conductive lines on said thin insulating layer arranged orthogonally relative to said line regions,
   d) forming a thin glass insulating layer over said conductive lines having a thickness of less than or equal to about 3000 Å, said glass insulating layer comprising a sublayer of undoped USG glass having a thickness of about 1000 Å and an overlayer of doped glass having a thickness of between about 1000 Å and about 2000 Å,
   e) reflowing said glass insulating layer to provide planarization thereof,
   f) forming contacts to said cells through said insulating layer after reflowing thereof,
   g) forming a metal layer on said glass insulating layer,
   h) depositing a resist layer on said metal layer,
   i) exposing said resist layer with a metal pattern, etching through said resist layer to form patterned metal and removing said resist layer,
   j) depositing a second resist layer onto said patterned metal, and exposing said second resist layer with a custom code pattern,
   k) developing said resist layer into a mask,
   l) etching exposed areas of said insulating layer to form openings exposing selected areas of said conductive lines,
   m) implanting impurity ions into said substrate adjacent to said conductive lines through said openings in said insulating layer,
   n) removing said resist layer,
   o) passivating said device with a thin layer,
   p) activating said implanted impurity ions by annealing said device at a temperature between about 420° C. and about 520° C. in gas comprising nitrogen gas $N_2$ alone or with hydrogen gas $H_2$,
   whereby the metallurgy and the electrical contacts to the substrate, line regions and conductor lines are protected from adverse effect during annealing.

2. A method in accordance with claim 1 wherein during the etching through said resist layer said doped glass overlayer is substantially all etched away leaving said undoped glass sublayer behind.

3. A method in accordance with claim 2 wherein said sublayer of undoped glass comprises USG.

4. A method in accordance with claim 3 wherein said overlayer comprises doped silicon dioxide in the form of BPSG.

5. A method in accordance with claim 1 wherein said passivation layer comprises a material selected from the group consisting of silicon nitride and silicon dioxide having a thickness of less than about 2,000 Å.

6. A method in accordance with claim 4 wherein said passivation layer comprises a material selected from the group consisting of silicon dioxide and silicon nitride having a thickness of between about 500 Å and about 2,000 Å.

7. A method in accordance with claim 1 wherein said glass insulating layer comprises a sublayer of undoped glass having a thickness of about 1000 Å and an overlayer of doped glass having a thickness of between about 1000 Å and about 2000 Å, and wherein said passivation layer comprises silicon nitride having a thickness of less than about 2,000 Å.

8. A method in accordance with claim 1 wherein said passivation layer comprises a material selected from the group consisting of silicon dioxide and silicon nitride having a thickness of less than about 2,000 Å.

9. A method in accordance with claim 2 wherein said conductive lines have a thickness of less than or equal to about 2000 Å.

10. A method in accordance with claim 3 wherein said conductive lines have a thickness of less than or equal to about 2000 Å.

11. A method in accordance with claim 4 wherein said conductive lines have a thickness of less than or equal to about 2000 Å.

12. A method in accordance with claim 5 wherein said conductive lines have a thickness of less than or equal to about 2000 Å.

13. A method in accordance with claim 6 wherein said conductive lines have a thickness of less than or equal to about 2000 Å.

14. A method in accordance with claim 7 wherein said conductive lines have a thickness of less than or equal to about 2000 Å.

15. A method in accordance with claim 8 wherein said conductive lines have a thickness of less than or equal to about 2000 Å.

16. A method in accordance with claim 10 wherein said conductive lines have a thickness of less than or equal to about 2000 Å.

17. A method of manufacturing a Read Only Memory device with an array of cells comprising:
   a) forming a plurality of closely spaced line regions with a first impurity type in and adjacent to the surface of a semiconductor substrate having a surface and a background impurity of a second opposite type,
   b) forming a thin insulating layer on said surface of said substrate,
   c) forming a plurality of closely spaced, parallel, thin, electrically conductive lines on said thin insulating layer arranged orthogonally relative to said line regions,
   d) forming a thin glass insulating layer over said conductive lines having a thickness of less than or equal to about 3000 Å, said thin glass insulating layer comprising a sublayer of undoped USG glass having a thickness of about 1000 Å and an overlayer of doped BPSG glass having a thickness of between about 1000 Å and about 2000 Å,
   e) reflowing said glass insulating layer to provide planarization thereof,
   f) forming contacts to said cells through said insulating layer after reflowing thereof,
   g) forming a metal layer on said glass insulating layer,
   h) depositing a resist layer on said metal layer, i) exposing said resist layer with a metal pattern, etching through said resist layer to form patterned metal and removing said resist layer, and etching substantially all of said doped BPSG glass layer, leaving behind said USG layer, j) depositing a second resist layer onto said patterned metal, and exposing said second resist layer with a custom code pattern, k) developing said resist layer into a mask, l) etching exposed areas of said insulating layer to form openings exposing selected areas of said conductive lines, m) implanting impurity ions into said substrate adjacent to said conductive lines through said openings in said insulating layer, n) removing said resist layer, o) passivating said device with a thin layer, p) activating said implanted impurity ions by annealing said device at a temperature between about 420° C. and about 520° C. in a gas comprising nitrogen gas $N_2$ alone or in combination with hydrogen gas $H_2$, whereby the metallurgy and the electrical contacts to the substrate, line regions and conductor lines are protected from adverse effect during annealing.

18. A method in accordance with claim 17 wherein said remaining thickness of said USG layer is between about 500 Å and 1,500 Å.

* * * * *